(12) United States Patent
Jeon et al.

(10) Patent No.: US 6,888,210 B2
(45) Date of Patent: May 3, 2005

(54) LATERAL DMOS TRANSISTOR HAVING REDUCED SURFACE FIELD

(75) Inventors: Chang-ki Jeon, Kimpo (KR); Min-hwan Kim, Boocheon (KR); Sung-lyong Kim, Suwon (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 0 days.

(21) Appl. No.: 10/360,518

(22) Filed: Feb. 7, 2003

(65) Prior Publication Data

US 2003/0218188 A1 Nov. 27, 2003

(30) Foreign Application Priority Data

Feb. 8, 2002 (KR) ................................ 10-2002-0007528

(51) Int. Cl.[7] ........................ H01L 23/58; H01L 29/76; H01L 29/94; H01L 31/062; H01L 31/113
(52) U.S. Cl. ........................ 257/492; 257/493; 257/343
(58) Field of Search ................................ 257/331, 343, 257/492, 493

(56) References Cited

U.S. PATENT DOCUMENTS 4,300,150 A * 11/1981 Colak ........................ 257/336

* cited by examiner

Primary Examiner—Howard Weiss
(74) Attorney, Agent, or Firm—Townsend and Townsend and Crew LLP

(57) ABSTRACT

In accordance with the present invention, a metal oxide semiconductor (MOS) transistor has a substrate of a first conductivity type. A drift region of a second conductivity type is formed over the substrate. A body region of the first conductivity type is formed in the drift region. A source region of the second conductivity is formed in the body region. A gate extends over a surface portion of the body region and overlaps each of the source region and the body region such that the surface portion of the body region forms a channel region of the transistor. A drain region of the second conductivity type is formed in the drift region. The drain region is laterally spaced from the source region a first predetermined distance. A first buried layer of the first conductivity type extends into the substrate and the drift region. The first buried layer laterally extends between the source and drain regions.

13 Claims, 11 Drawing Sheets

NUMBER OF P-TYPE REGIONS AND DISTANCE
BETWEEN SECOND P-TYPE BOTTOM LAYER
AND N-TYPE BURIED LAYER

○ : P-TYPE IMPURITY ION

US 6,888,210 B2

LATERAL DMOS TRANSISTOR HAVING REDUCED SURFACE FIELD

CROSS-REFERENCES TO RELATED APPLICATIONS

This application claims priority to Korean patent application number 2002-7528, filed Feb. 8, 2002, which is incorporated herein by reference.

BACKGROUND OF THE INVENTION

The present invention relates to a lateral double diffused metal oxide semiconductor (DMOS) transistor, and more particularly, to a lateral DMOS transistor having reduced surface field (RESURF).

In general, a breakdown voltage of a lateral DMOS transistor is closely related to the thickness of an epitaxial layer. For example, when the thickness of the epitaxial layer is reduced, the breakdown voltage of the lateral DMOS transistor is reduced. Nowadays, a lateral DMOS transistor having a thin epitaxial layer and a high breakdown voltage can be fabricated by using RESURF technology.

FIG. 1 is a sectional view of a conventional lateral DMOS transistor 10. Lateral DMOS transistor 10 has an n-type drift region 12 formed on a p-type silicon substrate 11. A p-type bottom layer 13 and an n-type buried layer 14 are located along the interface between p-type silicon substrate 11 and n-type drift region 12. P-type bottom layer 13 and n-type buried layer 14 are laterally spaced a predetermined distance apart. N+-type drain region 17 and n-type buried layer 14 are formed so that n+-type drain region 17 is located above n-type buried layer 14 along the vertical dimension. A p-type top region 15 and an n+-type drain region 17 are formed in n-type drift region 12. A p-type well region 19 is formed over and in contact with p-type bottom layer 13, and a p-type body region 18 is formed over and in contact with p-type well region 19. An n+-type source region 16 is formed in p-type body region 18.

A gate insulating layer 20 is formed on portions of p-type body region 18 to which n-type drift region 12 is adjacent, n-type drift region 12, and n+-type source region 16. Then, a gate conductive layer 21 is formed on gate insulating layer 20. A source electrode 22 is formed to contact portions of n+-type source region 16 and p-type body region 18. A drain electrode 23 is formed to contact a portion of n+-type drain region 17. Gate conductive layer 21, source electrode 22, and drain electrode 23 are electrically insulated from one another by an interlevel dielectric layer 24.

A common drawback of the FIG. 1 transistor is the high electric field present at the corner of p-type top region 15 near n+-type drain region 17. N-type buried layer 14 is formed directly below n+-type drain 17 along the vertical dimension to help reduce this high electric field by absorbing some of the field. However, this structure does not result in any significant reduction in the high electric field. This high electric field at the interface between the silicon layer and oxide layer cause carriers that are generated in the depletion region to be trapped in the oxide layer, thereby deteriorating the reliability of the lateral DMOS transistor. Also, in lateral DMOS transistors, most charges of an operating current flow near the silicon surface. In the conventional lateral DMOS transistor, impact ionization is accelerated by the high electric field at the interface between the silicon layer and the oxide layer, and thus the breakdown voltage is reduced as the operating current is increased. These mechanisms are described in more detail using FIGS. 2 and 3.

FIG. 2 illustrates the electric field distribution in the lateral DMOS transistor of FIG. 1 when 600 V is applied to the drain. A region of high electric field can be seen around n-type buried layer 14. This region is shown by the cross-hatched region labeled as A. Another region of high electric field can be seen around the surface of the silicon under one end of drain electrode 23. This region is shown by the cross-hatched region labeled as A'. The carriers generated in the depletion region are accelerated by the high electric field of region A'. Consequently, the accelerated carriers are trapped in the oxide layer directly above region A', thereby deteriorating the reliability of the device.

FIG. 3 illustrates the current density in the lateral DMOS transistor of FIG. 1 when 600 V and 6 V are applied to the drain and gate, respectively. As can be seen, most of the current bypasses p-type top region 15 and flows through the surface of the silicon layer when approaching drain electrode 23. The current is indicated by letter B. Accordingly, impact ionization is accelerated by the high electric field at the surface of the silicon layer, reducing the breakdown voltage as the current is increased.

Thus, a lateral DMOS transistor having reduced surface electric field is desirable.

SUMMARY OF THE INVENTION

In accordance with the present invention, a metal oxide semiconductor (MOS) transistor has a substrate of a first conductivity type. A drift region of a second conductivity type is formed over the substrate. A body region of the first conductivity type is formed in the drift region. A source region of the second conductivity is formed in the body region. A gate extends over a surface portion of the body region and overlaps each of the source region and the body region such that the surface portion of the body region forms a channel region of the transistor. A drain region of the second conductivity type is formed in the drift region. The drain region is laterally spaced from the source region a first predetermined distance. A first buried layer of the first conductivity type extends into the substrate and the drift region. The first buried layer laterally extends between the source and drain regions.

In one embodiment, the first buried layer has a laterally non-uniform impurity density.

In another embodiment, a second buried layer of the first conductivity type extends into the substrate and the drift region. The second buried layer is directly below the source region adjacent the first buried layer.

In another embodiment, a well region of the second conductivity type is formed in the drift region. The well region separates but is in contact with the body region and the second buried layer.

In another embodiment, a third buried layer of the second conductivity type extends into the substrate and the drift region directly below the drain region. The first and third buried layers are laterally spaced apart from one anther.

In another embodiment, the first buried layer is made up of five, six, seven, eight, or nine regions each region having a different impurity density.

In another embodiment, the first buried layer laterally extends a distance greater than one-half of the first predetermined distance.

In accordance with another embodiment of the invention, a MOS transistor is formed as follows. A substrate of a first conductivity type is provided. A drift region of a second conductivity type is formed over the substrate. A body region of the first conductivity type is formed in the drift region. A source region of the second conductivity is formed in the body region. A gate is formed extending over a surface portion of the body region and overlapping each of the source region and the body region such that the surface portion of the body region forms a channel region of the transistor. A drain region of the second conductivity type is formed in the drift region. The drain region is laterally spaced from the source region a first predetermined distance. A first buried layer of the first conductivity type is formed extending into the substrate and the drift region. The first buried layer laterally extends from below the source region to a predetermined location between the body and drain regions.

In one embodiment, the first buried layer has a laterally non-uniform impurity density.

In another embodiment, a well region of the second conductivity type is formed in the drift region. The well region separates but is in contact with the body region and a portion of the first buried layer directly below the source region.

In another embodiment, a second buried layer of the second conductivity type is formed extending into the substrate and the drift region directly below the drain region. The first and second buried layers are laterally spaced apart from one anther.

In another embodiment, the formation of the first buried layer includes implanting impurities of the first conductivity type into an upper surface of the substrate through a plurality of openings of a masking layer. The openings of the masking layer are laterally arranged such that a spacing between each adjacent pair of openings increases in a direction from where the source region is formed toward where the drain region is formed.

In another embodiment, the first buried layer laterally extends a distance greater than one-half of the first predetermined distance.

A further understanding of the nature and advantages of the inventions herein may be realized by reference to the remaining portions of the specification and the attached drawings.

DETAILED DESCRIPTION OF THE INVENTION

Figure 4:
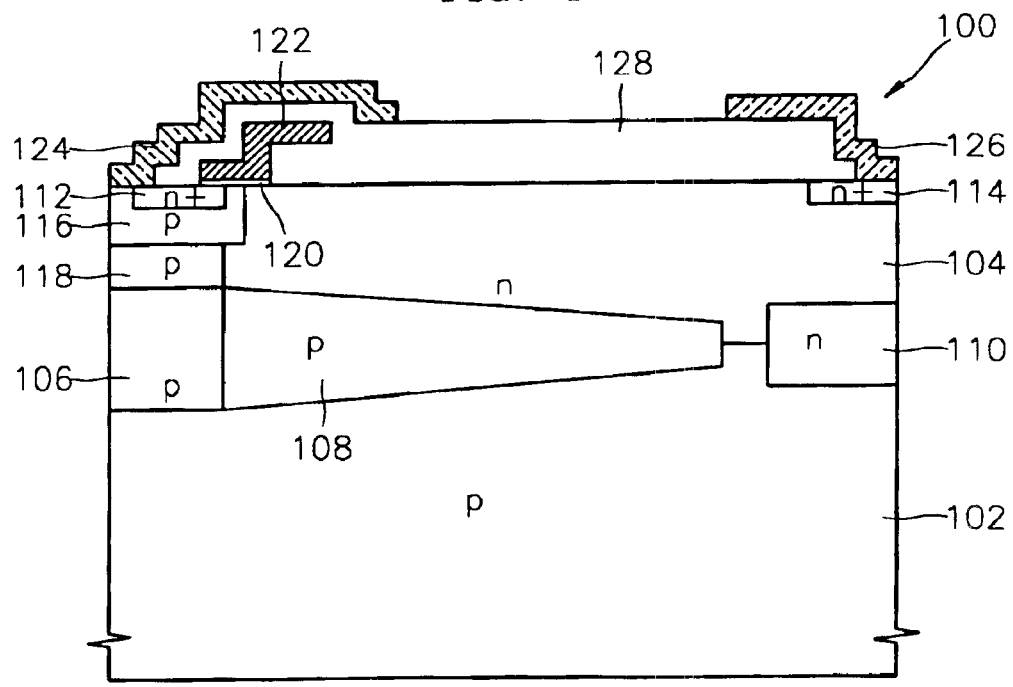
FIG. 4 is a sectional view of a lateral DMOS transistor according to an embodiment of the present invention.

FIG. 4 is a sectional view of a lateral double diffused metal oxide semiconductor (DMOS) transistor 100 according to an embodiment of the present invention. Lateral DMOS transistor 100 includes an n-type drift region 104 formed on a p-type silicon substrate 102. A first p-type bottom layer 106, a second p-type bottom layer 108, and an n-type buried layer 110 are formed along the interface between p-type silicon substrate 102 and n-type drift region 104. The first and second p-type bottom layers 106 and 108 abut each other laterally, and second p-type bottom layer 106 is spaced laterally from n-type buried layer 110 a predetermined distance. The upper and lower surfaces of second p-type bottom layer 108 contact n-type drift region 104 and p-type silicon substrate 102, respectively.

N+-type drain region 114 is formed along the surface of n-type drift region 104. N+-type source region 112 is formed in a p-type body region 116 which is in turn formed in n-type drift region 104. P-type body region 116 and first p-type bottom layer 106 are separated by a p-type well region 118. N+-type drain region 114 and n-type buried layer 110 are vertically aligned as shown. Second p-type bottom layer 108 has a graded impurity density which is highest at its source-side and lowest at its drain-side. To achieve this graded impurity density, in one embodiment, second p-type bottom layer 108 is formed of a plurality of overlapping p-type regions each having different impurity densities. Namely, the p-type region closest to first p-type bottom layer 106 has the highest impurity density, and the p-type region closest to n-type buried layer 110 has the lowest impurity density.

A gate insulating layer 120 is formed over a portion of each of p-type body region 116, n-type drift region 104, and n+-type source region 112. A gate conductive layer 122 is formed over gate insulating layer 120. A source electrode 124 is formed contacting portions of a portion of each of n+-type source region 112 and p-type body region 116. A drain electrode 126 is formed contacting a portion of n+-type drain region 114. Gate conductive layer 122, source electrode 124, and drain electrode 126 are electrically separated from one another by an interlevel dielectric layer 128.

Figure 5:
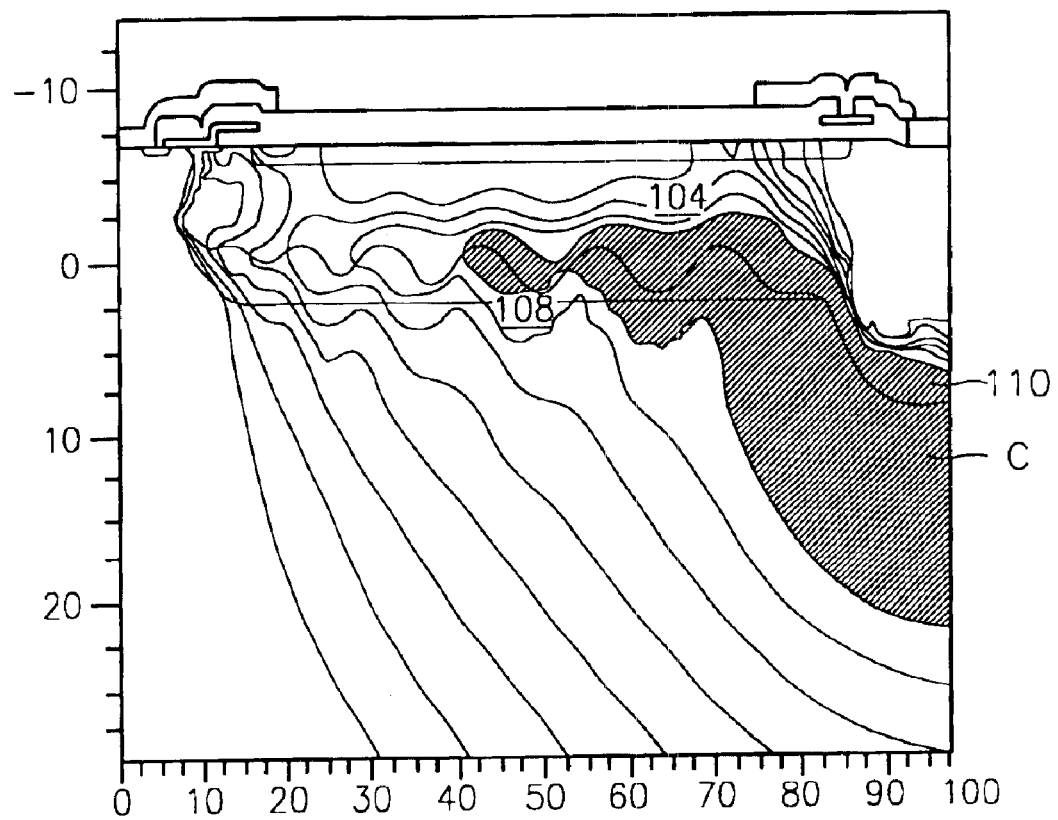
FIG. 5 illustrates the electric field distribution in the lateral DMOS transistor according to the present invention when 600 V is applied to its drain.

FIG. 5 illustrates the electric field distribution in the lateral DMOS transistor according to the present invention when 600 V is applied to the drain. Regions of high electric field can be seen laterally extending through second p-type bottom layer 108, the region between second p-type bottom layer 108 and n-type buried layer 110, and around n-type buried layer 110. These regions of high electric field are shown by the cross-hatched regions labeled as C. As can be seen, no regions of high electric field are present along the surface of the silicon. In particular, since the impurity density on the left-hand side of second p-type bottom layer 108 is higher than that on its right-hand side, the impurity density on the left-hand side of drift region 104 is lower than that on its right-hand side. Consequently, depletion in drift region 104 occurs more easily toward the left-hand side of FIG. 5 having a relatively lower impurity density. As a result, a voltage is more evenly distributed along the surface of drift region 104 to ensure a high breakdown voltage. Also, with no high electric field regions along the silicon surface, no trapping of carriers generated in the depletion region occurs in the oxide layer over the silicon surface, thus improving the reliability of the device.

Figure 6:
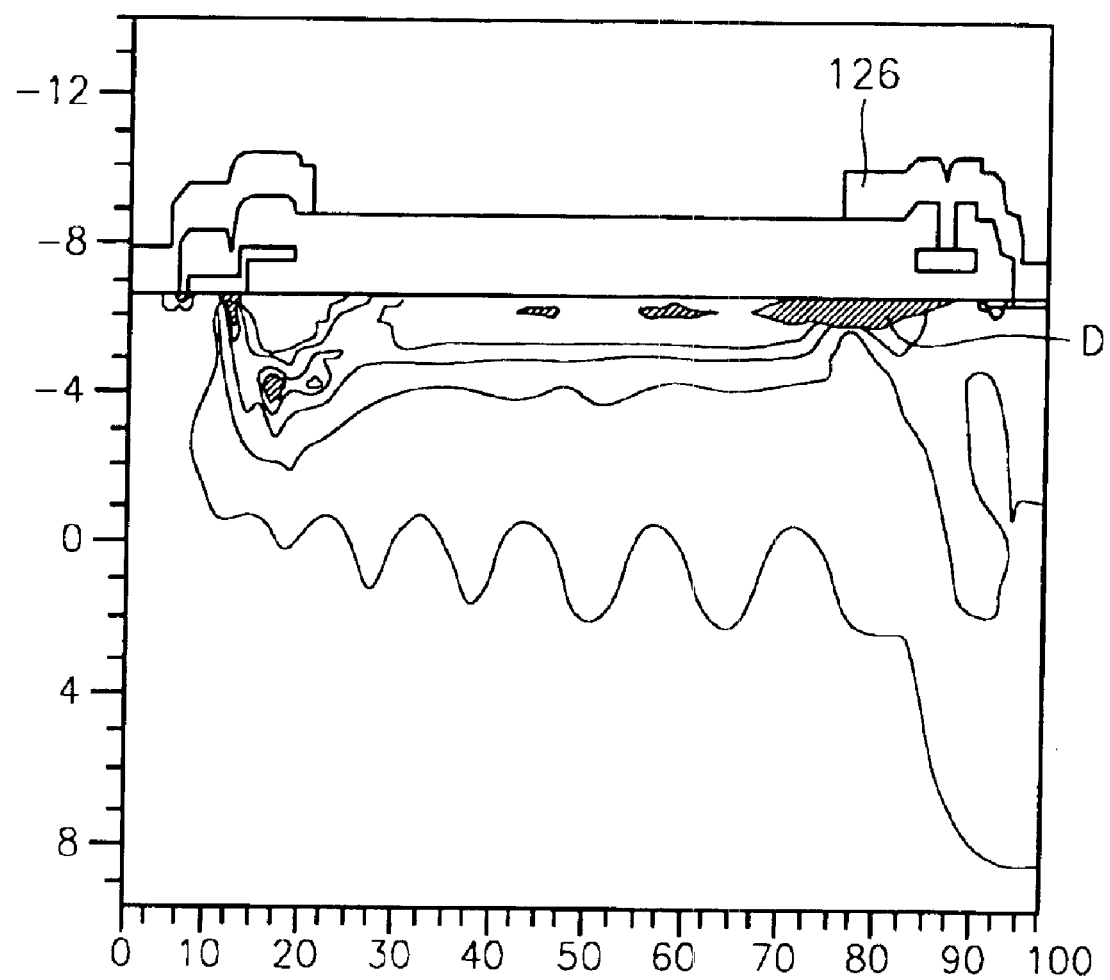
FIG. 6 illustrates the current density in the lateral DMOS transistor according to the present invention when 600 V and 6 V are applied to the drain and gate, respectively.

FIG. 6 illustrates the current density in the lateral DMOS transistor according to the present invention when 600 V and 6 V are applied to the drain and the gate, respectively. As charges approach drain electrode 126, most of the charges flow through the surface of the silicon as shown by the cross-hatched region labeled as D. However, since the high electric field on the silicon surface near the drain electrode 126 is eliminated as described above, impact ionization is reduced so as not to reduce the breakdown voltage even if the amount of current increases.

Figure 1:
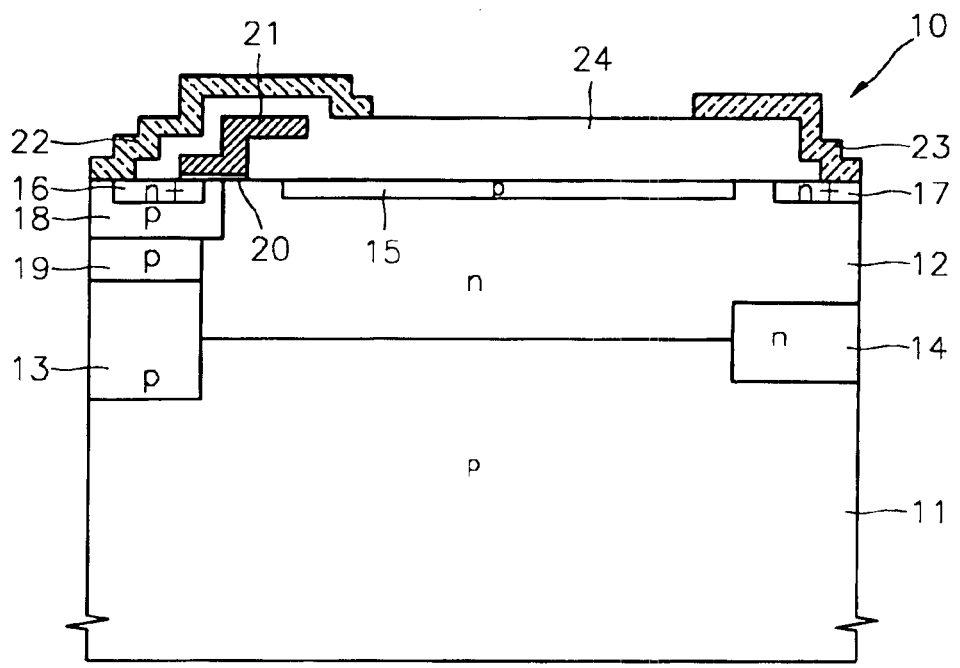
FIG. 1 is a sectional view of a conventional lateral double diffused metal oxide semiconductor (DMOS) transistor.
Figure 2:
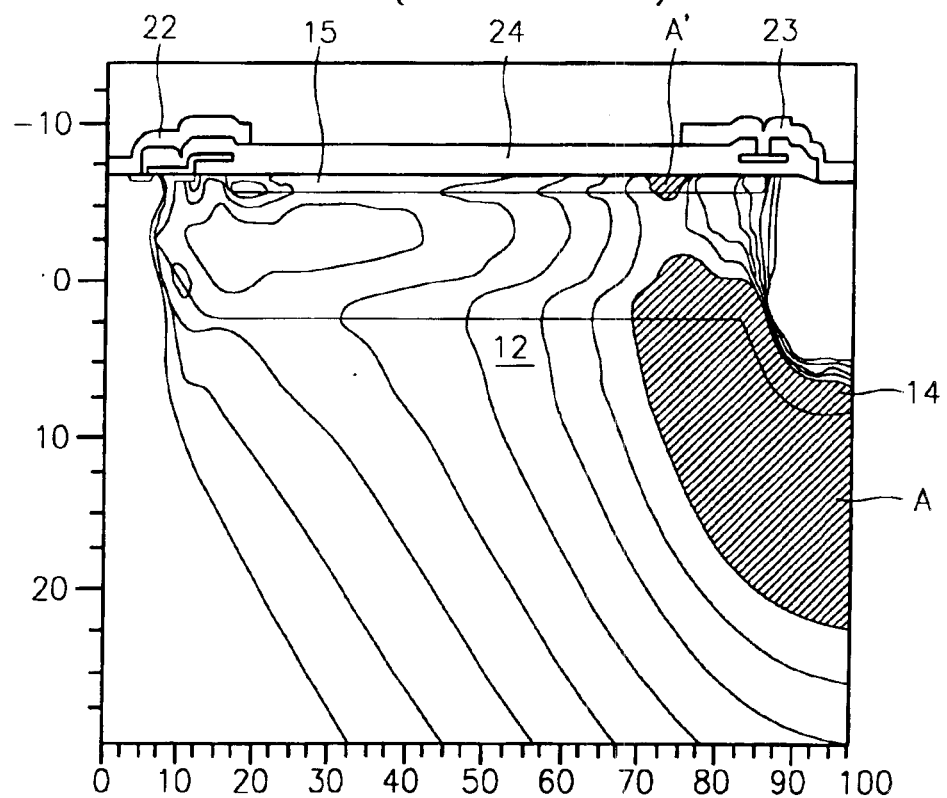
FIG. 2 illustrates the electric field distribution in the lateral DMOS transistor of FIG. 1 when 600 V is applied to its drain.
Figure 3:
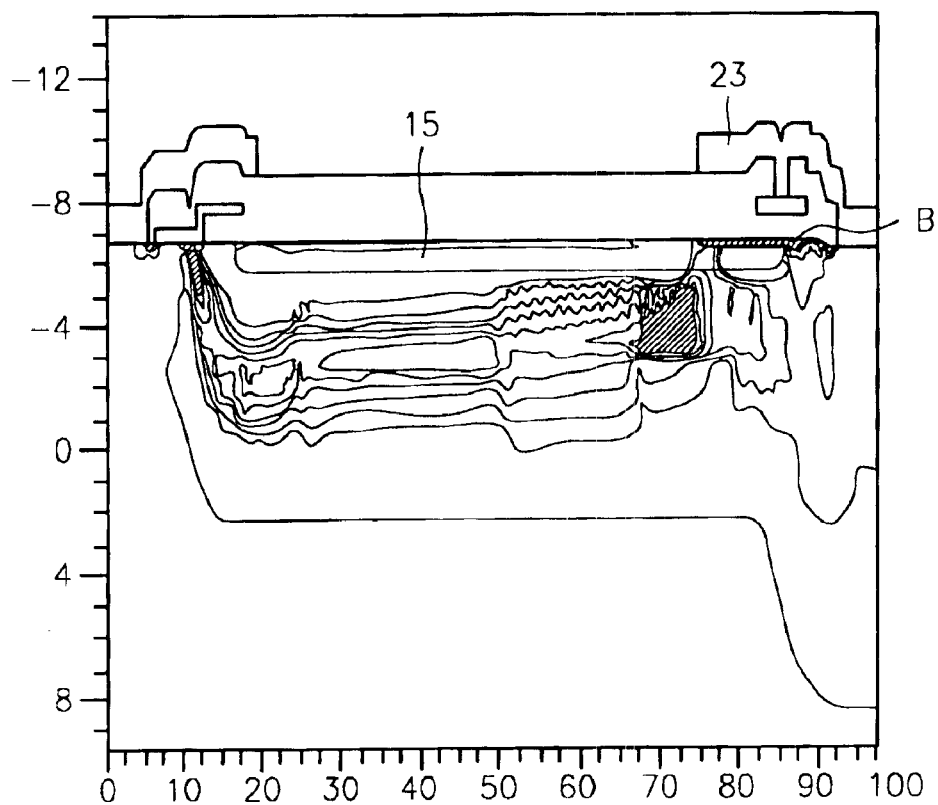
FIG. 3 illustrates the current density in the lateral DMOS transistor of FIG. 1 when 600 V and 6 V are applied to the drain and gate, respectively.
Figure 7:
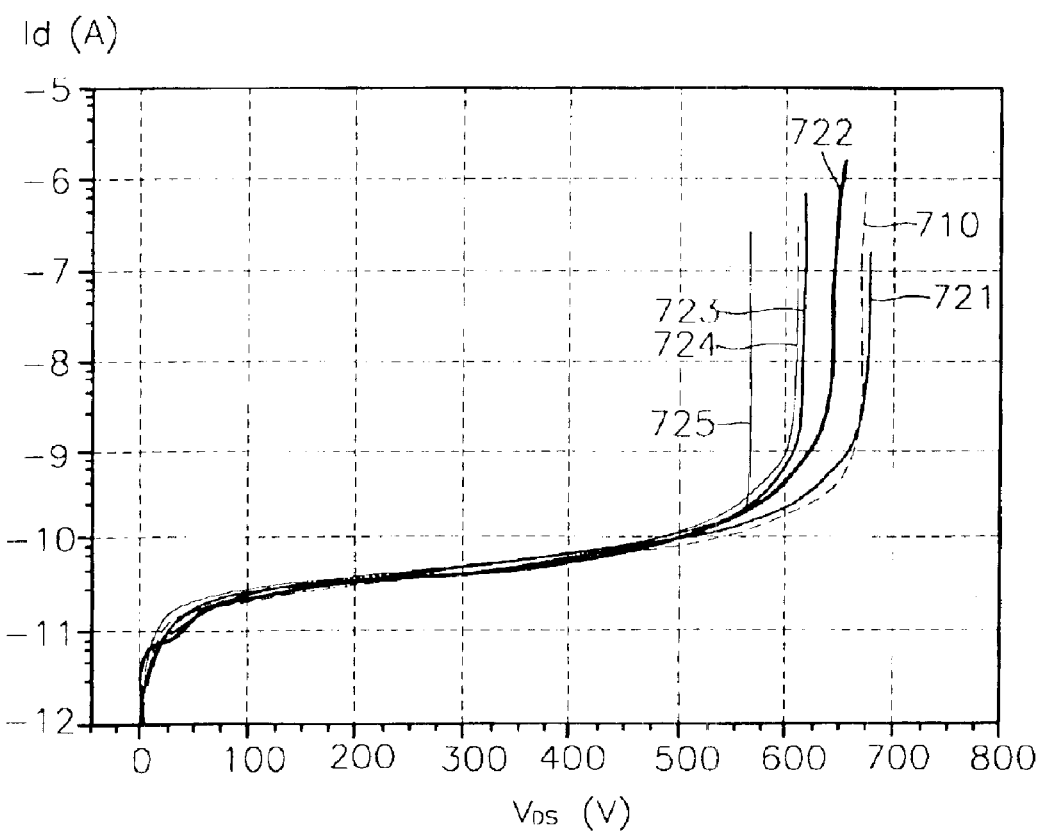
FIG. 7 is a graph comparing breakdown voltage of the lateral DMOS transistor according to the present invention with breakdown voltage of the conventional lateral DMOS transistor.

FIG. 7 is a graph comparing the breakdown voltage of the lateral DMOS transistor according to the present invention with the breakdown voltage of the conventional lateral DMOS transistor. Curve 710 corresponds to the conventional lateral DMOS transistor having a p-type top region as in FIG. 1. Curves 721 through 725 correspond to lateral DMOS transistors in accordance with the present invention having 6, 8, 10, 12, and 4 p-type regions that form the second p-type bottom layer 108, respectively.

Curve 721 (corresponding to the case of second p-type bottom layer 108 being formed of 6 p-type regions) is similar to the breakdown voltage curve 710 of the conventional lateral MOS transistor. If second p-type bottom layer 108 is formed of four or more than eight p-type regions, the breakdown voltage of the lateral DMOS transistor according to the present invention is lower than that of the conventional lateral DMOS transistor.

Figure 8:
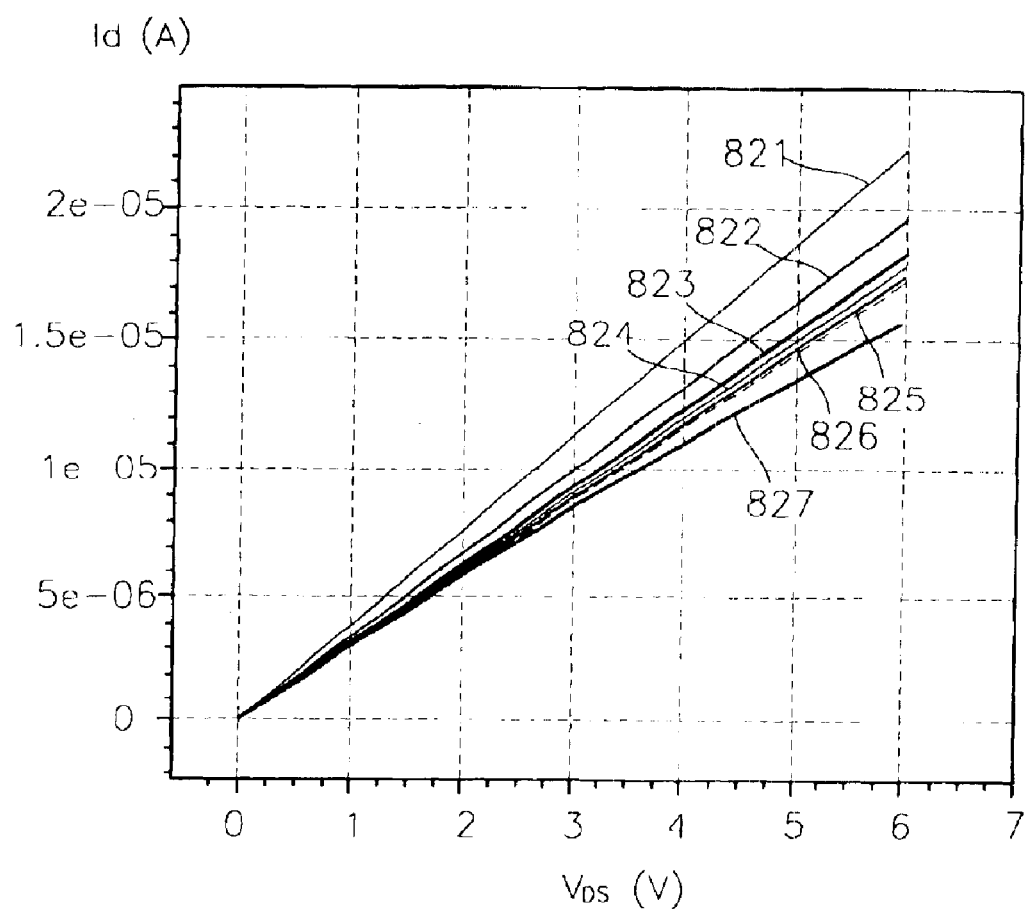
FIG. 8 is a graph comparing on-resistance of the lateral DMOS transistor according to the present invention with on-resistance of the conventional lateral DMOS transistor.

FIG. 8 is a graph comparing the on-resistance of the lateral DMOS transistor according to the present invention with the on-resistance of the conventional lateral DMOS transistor. Curve 827 corresponds to the conventional lateral DMOS transistor having a p-type top region as in FIG. 1. Curves 821 through 826 correspond to lateral DMOS transistors in accordance with the present invention having 0, 4, 6, 8, 10, and 12 p-type regions, respectively. The conventional lateral DMOS transistor has the greatest on-resistance, which is determined by the reciprocal of the slope of curve 827. For the lateral DMOS transistor according to the present invention, the on-resistance is reduced as the number of the p-type regions decreases.

Figure 9:
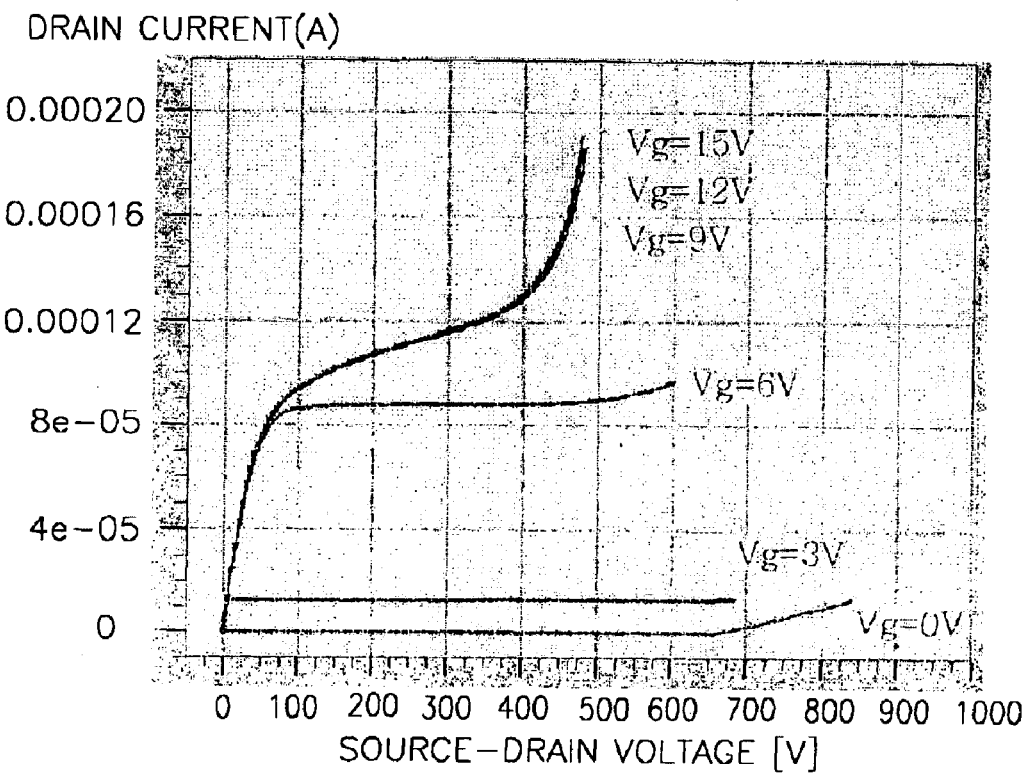
FIG. 9 is a graph illustrating drain current versus source-drain voltage for the conventional lateral DMOS transistor.
Figure 10:
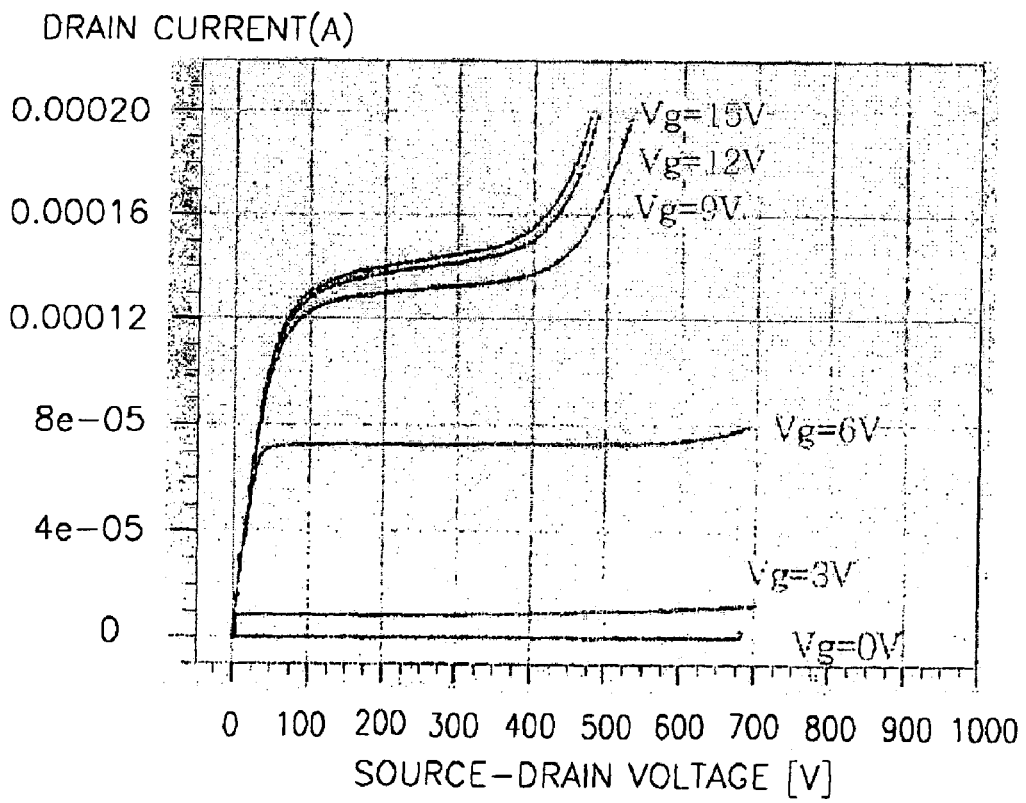
FIG. 10 is a graph illustrating drain current versus source-drain voltage for the lateral DMOS transistor according to the present invention.

FIGS. 9 and 10 are graphs illustrating the drain current versus source-drain voltage for various gate voltages for the conventional lateral DMOS transistor and the lateral DMOS transistor according to the present invention, respectively. As can be seen, when a gate voltage Vg of over 9 V is applied, the drain current of the lateral DMOS transistor according to the present invention is greater than that of the conventional lateral DMOS transistor.

Figure 11:
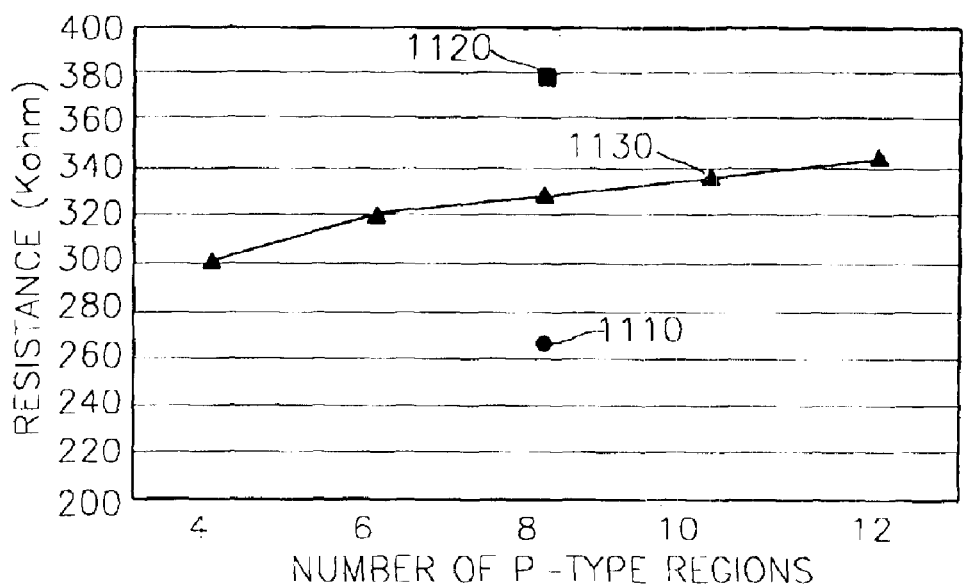
FIG. 11 is a graph comparing on-resistance of the lateral DMOS transistor according to the present invention with on-resistance of the conventional DMOS transistor for varying number of p-type regions.

FIG. 11 is a graph comparing the on-resistance of the lateral DMOS transistor according to the present invention to that of the conventional DMOS transistor for varying number of p-type regions which form the second p-type bottom layer 108 in the lateral DMOS transistor according to the present invention. Data point 1110 and 1120 denote the on-resistances of the conventional lateral DMOS transistors without and with the p-type top region, respectively. Curve 1130 show the on-resistance of the lateral DMOS transistor for varying number of p-type regions according to the present invention.

As can be seen, the on-resistance of the device is the smallest in the conventional lateral DMOS transistor without the p-type top region, and the greatest in the conventional lateral DMOS transistor with the p-type top region. The on-resistance of the lateral DMOS transistor according to the present invention is greater than that of the conventional lateral DMOS transistor without the p-type top region and smaller than that of the conventional lateral DMOS transistor with the p-type top region. Though the on-resistance of the lateral DMOS transistor according to the present invention is greater than that of the conventional lateral DMOS transistor without the p-type top region, the breakdown voltage of the conventional lateral DMOS transistor without the p-type top region is remarkably smaller than that of the lateral DMOS transistor according to the present invention.

Figure 12:
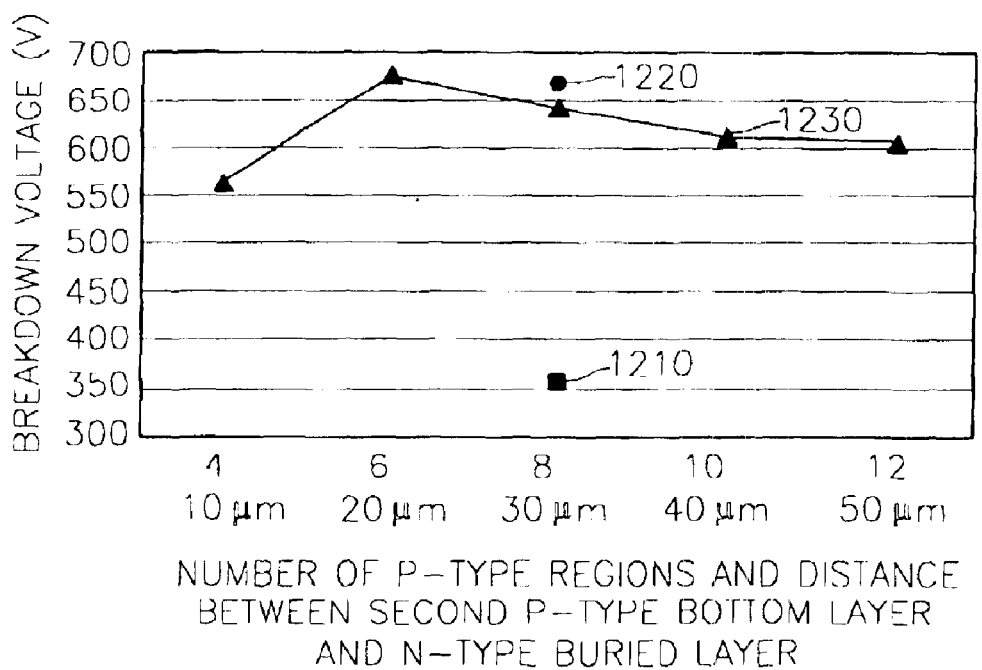
FIG. 12 is a graph comparing breakdown voltage of the lateral DMOS transistor according to the present invention with breakdown voltage of the conventional DMOS transistor for varying number of the p-type regions.

FIG. 12 is a graph comparing the breakdown voltage of the lateral DMOS transistor according to the present invention with that of the conventional DMOS transistor for varying number of p-type regions which form the second p-type bottom layer in the lateral DMOS transistor according to the present invention. Data points 1210 and 1220 denote the breakdown voltages of the conventional lateral DMOS transistors without and with the p-type top region, respectively. Curve 1230 denotes the breakdown voltage of the lateral DMOS transistor according to the present invention for varying number of p-type regions.

As can be seen, the breakdown voltage of the device is the greatest in the conventional lateral DMOS transistor with the p-type top region and the smallest in the conventional lateral DMOS transistor without the p-type top region. The breakdown voltage of the lateral DMOS transistor according to the present invention is greater than that of the conventional lateral DMOS transistor without the p-type top region and same or smaller than that of the conventional lateral DMOS transistor with the p-type top region depending on the number of the p-type regions which form the second p-type bottom layer. Though the breakdown voltage of the lateral DMOS transistor according to the present invention is the same or smaller than that of the conventional lateral DMOS transistor with the p-type top region, the on-resistance of the conventional lateral DMOS transistor with the p-type top region is remarkably greater than that of the lateral DMOS transistor according to the present invention.

FIGS. 13 through 17 are sectional views illustrating a method of fabricating the lateral DMOS transistor in accordance with one embodiment of the present invention.

Figure 13:
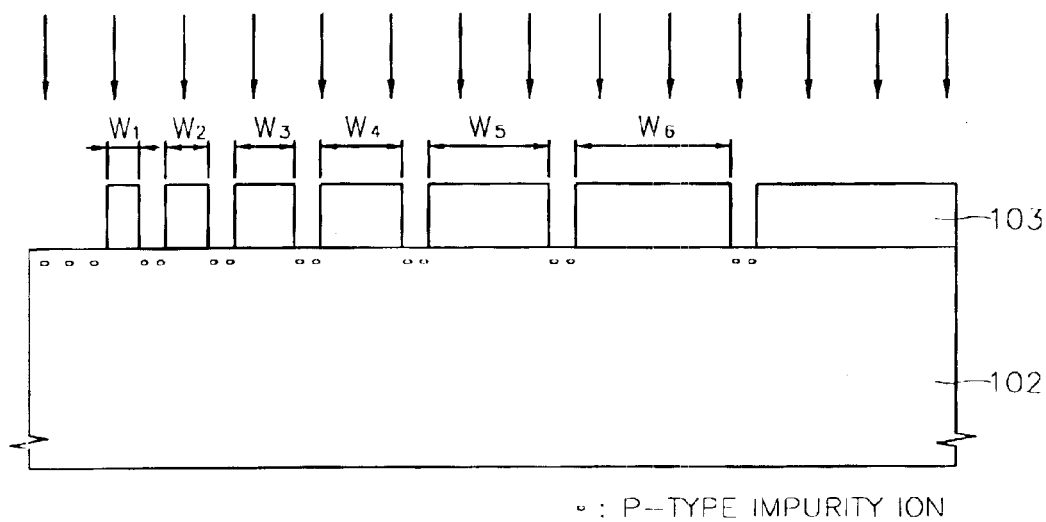
FIGS. 13 through 17 are sectional views illustrating a method of fabricating the lateral DMOS transistor according to the present invention.

Referring first to FIG. 13, p-type impurity ions are implanted into the upper surface of a p-type silicon substrate 102 to form the first and second p-type bottom layers 106 and 108. The impurity ions are implanted into the surface of substrate 102 in such manner that second p-type bottom layer 108 has varying impurity density along the lateral dimension. A mask layer 103 has a predetermined number of openings which are laterally spaced from one another. As shown, the spacing between the openings, marked in FIG. 12 as W1 through W6, gradually increase from the source-side of second p-type bottom layer 108 (i.e., left side in FIG. 12) to its drain-side (i.e., right side in FIG. 12). Namely, the spacing between the openings in mask layer 103 has the relationship W1<W2<W3<W4<W5<W6. In this manner, after the ion implantation and the later out-diffusion of the implanted impurities, a higher impurity density is obtained on the source-side of second p-type bottom layer 108 than on its drain side.

Figure 14:
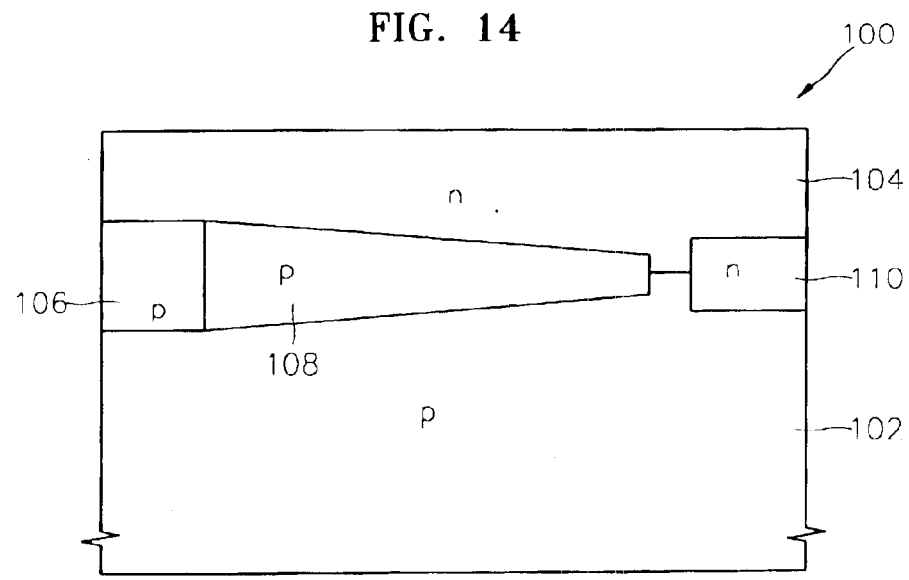

Referring next to FIG. 14, mask layer 103 is removed and an ion implantation mask layer (not shown) is used to form n-type buried layer 110. The ion implantation mask layer has an opening for exposing the surface of substrate 102 at the location of n-type buried layer 110. N-type impurity ions are then implanted into the exposed surface of substrate 102. The ion implantation mask layer is removed, and then n-type drift region 104 is formed on substrate 102 using epitaxial growth method.

In forming n-type drift region 104, the previously implanted p-type and n-type impurity ions diffuse out, thereby forming the first and second p-type bottom layers 106 and 108 and n-type buried layer 110 as shown. Because the implanted regions in FIG. 13 are more closely spaced on the source-side of second p-type bottom layer 108 than its drain-side, the out-diffusion of the implanted impurities overlap more along the source-side than the drain-side of second p-type bottom layer 108. In other words, because the spacing between adjacent implanted regions gradually increases from the source-side to the drain-side, after out-diffusion of the implanted impurities, less overlapping of the implanted impurities occurs from the source-side to the drain side. Thus, the impurity density in second p-type bottom layer 108 decreases from its source-side to its drain-side.

Figure 15:
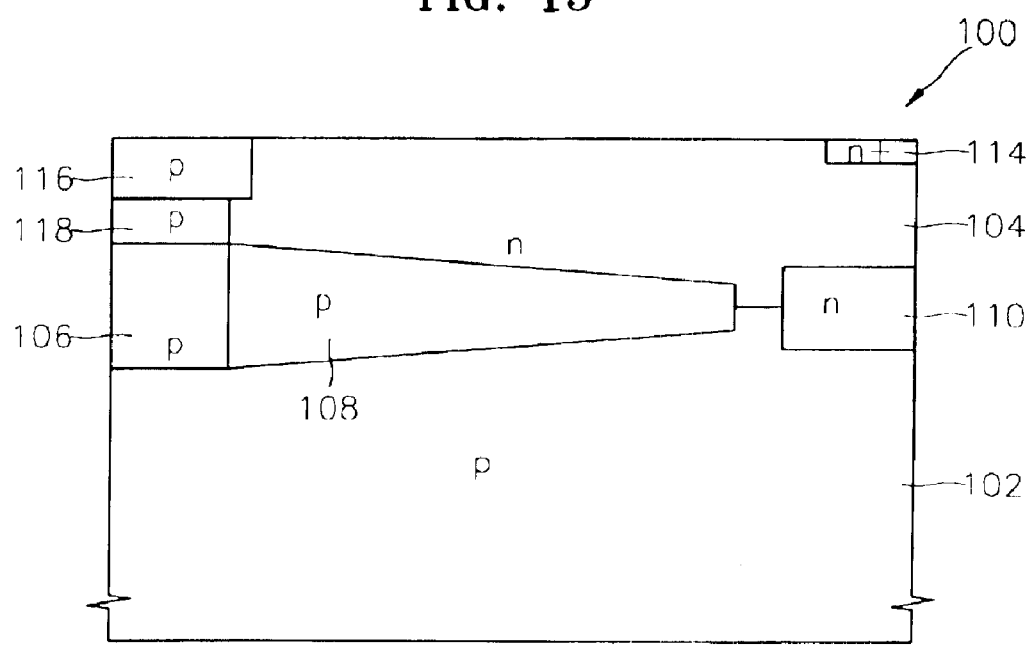

Referring to FIG. 15, p-type well region 118 is formed in n-type drift region 104 by first implanting p-type impurity ions into the upper portion of n-type drift region 104 using an ion implantation mask layer (not shown), and then diffusing the implanted impurities into n-type drift region 104 using a drive-in diffusion process. This step is carried out such that the p-type well region 118 contacts or overlaps first p-type bottom layer 106. Next, p-type body region 116 is formed in p-type well region 118 by first implanting p-type impurity ions into the upper portion of p-type well region 118 using an ion implantation mask layer (not shown), and then diffusing the implanted impurities into p-type well region 118 using a drive-in diffusion process.

Figure 16:
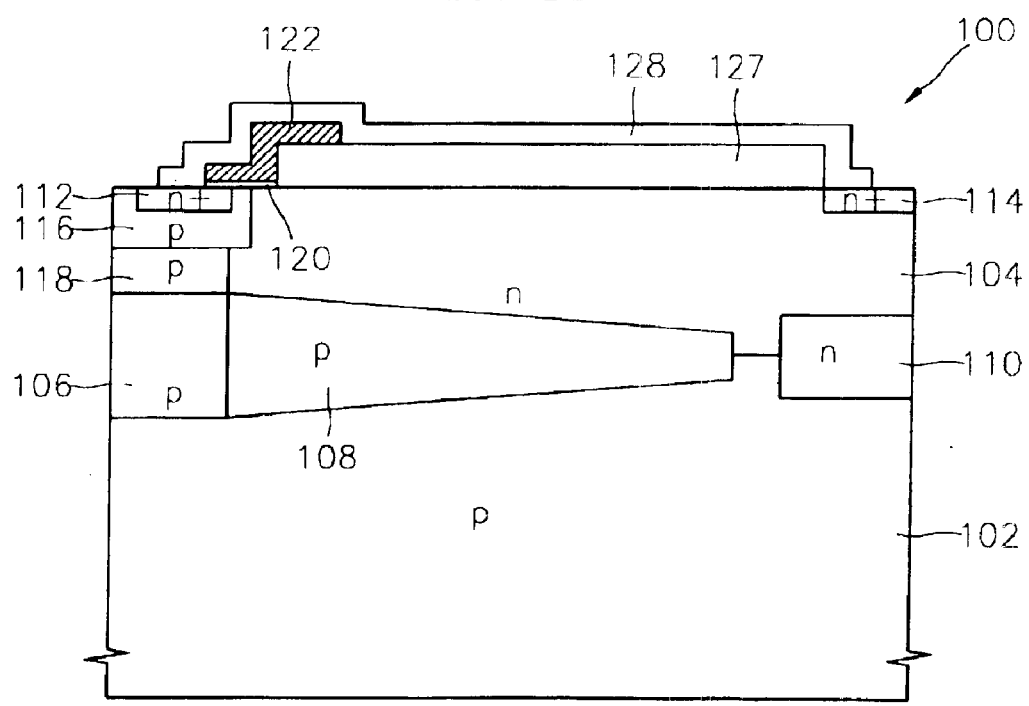

Referring next to FIG. 16, a gate insulating layer 120 is formed on a surface portion of each of p-type body region 116, n-type drift region 104, and n+-type source region 112. Thereafter, a first interlayer dielectric layer 127 is formed on a substantial portion of the surface of n-type drift region 104. Next, a gate conductive layer 122 which extends over gate insulating layer 120 and up and over a portion of the surface of first interlayer dielectric layer 127 is formed as shown.

Figure 17:
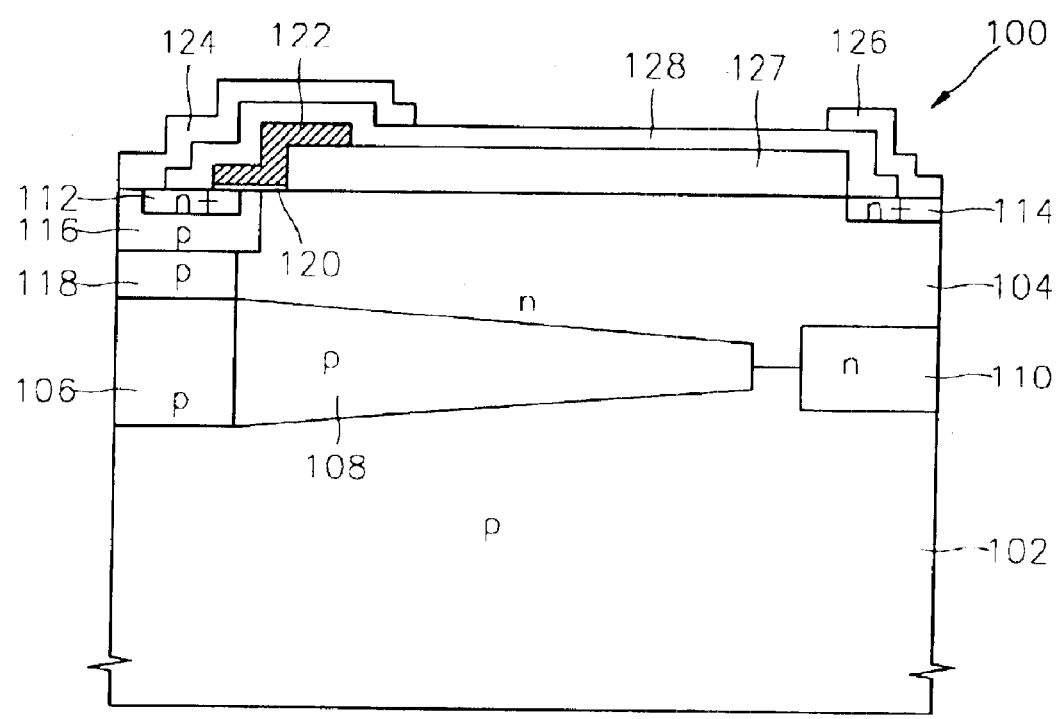

Referring to FIG. 17, n+-type source and drain regions 112 and 114 are formed by first implanting n-type impurity ions into an upper portion of each of p-type body region 116 and n-type drift region 104 respectively by using an ion implantation mask layer (not shown) and gate conductive layer 122 as masks, and then diffusing the implanted impurities into the respective regions using the drive-in diffusion process. A second interlayer dielectric layer 128 is formed over the structure except for surface portions of p-type body region 116, n+type source region 112, and n+-type drain region 114 as shown. These surface portions are left exposed so that electrical contact can be made to them. Thus, second interlayer dielectric layer 128 completely covers gate conductive layer 122 and first interlayer dielectric layer 127. Source electrode 124 contacting n+-type source region 122, and drain electrode 126 connecting n+-type drain region 114 are formed.

It is to be understood that the high temperature process steps (e.g., the source and drain drive-in diffusion steps) result in out-diffusion of the impurities in such areas as second p-type bottom layer 108. One skilled in the art can take these effects into account when designing the manufacturing process and structure of the lateral DMOS transistor so that the final transistor has the desired characteristics.

Thus, in accordance with the invention, a p-type bottom layer having laterally varying impurity density is formed between an n-type drift region and the silicon substrate in a lateral DMOS transistor. Accordingly, the electric field concentrated on the silicon surface near one end of the drain electrode is reduced to improve the reliability of the device. As a result, impact ionization on the surface of the device is repressed, and a safe operating area (SOA) is enlarged. Also, by eliminating the p-type stripe extending along the surface of the drift region between the source and drain of the prior art structure, the on-resistance of the transistor is improved. Further, a method of fabricating the lateral DMOS transistor in accordance with the present invention eliminates the p-type top region of the prior art. Moreover, the second p-type bottom layer is formed by using the same mask layer used to form the first p-type bottom layer. As a result, the number of mask layers used in fabricating the lateral DMOS transistor according to the present invention is reduced.

Although the invention has been described in terms of a specific process and structure, it will be obvious to those skilled in the art that many modifications and alterations may be made to the disclosed embodiment without departing from the invention. For example, one of skill in the art would understand that one could begin with a p-type substrate to manufacture a p-channel lateral DMOS transistor, which has silicon layers with complementary doping relative to the n-channel lateral DMOS transistor shown in FIG. 4. Also, the manufacturing method is not limited to using one mask layer to form the first and second p-type bottom layers. Additional mask layers may be used to enable optimizing each of the first and second p-type bottom layers separately. Hence, these modifications and alterations are intended to be within the spirit and scope of the invention as defined by the appended claims.

What is claimed is:

1. A metal oxide semiconductor (MOS) transistor comprising:
    a substrate of a first conductivity type;
    a drift region of a second conductivity type over the substrate;
    a body region of the first conductivity type in the drift region;
    a source region of the second conductivity in the body region;
    a gate extending over a surface portion of the body region and overlapping each of the source region and the drift region such that the surface portion of the body region forms a channel region of the transistor;
    a drain region of the second conductivity type in the drift region, the drain region being laterally spaced from the source region a first predetermined distance; and
    a first buried layer of the first conductivity type extending into the substrate and the drift region, the first buried layer laterally extending between the source and drain regions and having a laterally non-uniform impurity density.

2. The MOS transistor of claim 1 wherein the impurity density of the first buried layer is higher along its source side than along its drain side.

3. The MOS transistor of claim 1 wherein the impurity density of the first buried layer dercases from its source side to its drain side.

4. The MOS transistor of claim 1 further comprising a second buried layer of the first conductivity type extending into the substrate and the drift region, the second buried layer being directly below the source region adjacent the first buried layer.

5. The MOS transistor of claim 4 wherein the impurity density of the first buried layer is highest near the second buried layer and decreases in a direction away from the second buried layer.

6. The MOS transistor of claim 4 further comprising a well region of the second conductivity type in the drift region, the well region separating but being in contact with the body region and the second buried layer.

7. The MOS transistor of claim 1 further comprising a third buried layer of the second conductivity type extending into the substrate and the drift region directly below the drain region.

8. The MOS transistor of claim 7 wherein the first and third buried layers are laterally spaced apart from one anther.

9. The MOS transistor of claim 1 wherein the first buried layer is made up of a plurality of contiguous regions each having a different impurity density.

10. The MOS transistor of claim 1 further comprising:

a drain electrode contacting the drain region;

a source electrode contacting the source region; and an interlayer dielectric layer electrically isolating the gate, the source electrode, and the drain electrode from one another.

11. The MOS transistor of claim 1 wherein the first conductivity type is p-type and the second conductivity type is n-type.

12. The MOS transistor of claim 1 wherein the first buried layer laterally extends a distance greater than one-half of the first predetermined distance.

13. The MOS transistor of claim 1 wherein the first buried layer laterally extends from below the body region to a predetermined location between the body and drain regions.

* * * * *